United States Patent
Carter et al.

(10) Patent No.: US 8,565,823 B2
(45) Date of Patent: Oct. 22, 2013

(54) BASESTATION FOR CELLULAR COMMUNICATION SYSTEM

(75) Inventors: Alan Carter, Swindon (GB); Stephen Whittaker, Newbury (GB)

(73) Assignee: Ubiquisys Limited, Swindon (GB)

( * ) Notice: Subject to any disclaimer, the term of this patent is extended or adjusted under 35 U.S.C. 154(b) by 968 days.

(21) Appl. No.: 11/801,420

(22) Filed: May 8, 2007

(65) Prior Publication Data

US 2008/0058017 A1    Mar. 6, 2008

(30) Foreign Application Priority Data

Aug. 29, 2006  (GB) .................................. 0617004.7
Feb. 2, 2007  (GB) .................................. 0702089.4

(51) Int. Cl.
*H04B 1/38*  (2006.01)

(52) U.S. Cl.
USPC ............ 455/561; 455/13.2; 455/24; 455/502; 455/125; 455/135; 370/379

(58) Field of Classification Search
USPC .......... 455/13.2, 24, 502, 561, 125, 135, 208, 455/265, 255, 315–322; 370/379
See application file for complete search history.

(56) References Cited

U.S. PATENT DOCUMENTS

| | | | | |
|---|---|---|---|---|
| 5,404,575 | A | * | 4/1995 | Lehto .............................. 455/502 |
| 5,524,029 | A | * | 6/1996 | Takenaka et al. ............. 375/356 |
| 5,844,939 | A | * | 12/1998 | Scherer et al. ................ 375/219 |
| 6,208,871 | B1 | | 3/2001 | Hall et al. |
| 6,975,877 | B1 | | 12/2005 | Dergun et al. |
| 2002/0196768 | A1 | | 12/2002 | Ohgoshi et al. |
| 2003/0012158 | A1 | | 1/2003 | Jin et al. |
| 2003/0087617 | A1 | * | 5/2003 | Shohara ..................... 455/192.2 |
| 2003/0147362 | A1 | | 8/2003 | Dick et al. |
| 2003/0152177 | A1 | | 8/2003 | Cahill-O'Brien |
| 2004/0032836 | A1 | | 2/2004 | Grilli et al. |
| 2004/0081117 | A1 | * | 4/2004 | Malek et al. .................. 370/324 |
| 2005/0043046 | A1 | | 2/2005 | Lee |
| 2007/0178875 | A1 | * | 8/2007 | Rao et al. .................... 455/343.1 |

FOREIGN PATENT DOCUMENTS

| | | |
|---|---|---|
| EP | 0702464 A1 | 3/1996 |
| EP | 0732817 | 9/1996 |
| EP | 1148686 A1 | 10/2001 |
| EP | 1191711 | 3/2002 |
| EP | 1280024 A1 | 1/2003 |
| EP | 1180696 A3 | 10/2004 |
| EP | 1211824 A3 | 10/2005 |
| EP | 1675279 | 6/2006 |

(Continued)

OTHER PUBLICATIONS

Search Report dated Sep. 27, 2007 for corresponding Application No. GB0702089.4.

(Continued)

*Primary Examiner* — Meless N. Zewdu
*Assistant Examiner* — Michael Nguyen
(74) *Attorney, Agent, or Firm* — Weaver Austin Villeneuve & Sampson LLP

(57) ABSTRACT

A basestation in a cellular communication system corrects frequency errors in signals generated within the basestation. The frequency errors may be corrected on the basis of signals transmitted by one or more other basestation within the network. As an alternative, the basestation may request information from one or mobile devices that are also able to detect transmissions from other basestations.

5 Claims, 3 Drawing Sheets

(56) References Cited

FOREIGN PATENT DOCUMENTS

| GB | 2428942 A | 7/2007 |
|---|---|---|
| GB | 2293526 A1 | 10/2008 |
| GB | 2316835 A1 | 10/2008 |
| JP | A H05-063633 | 3/1993 |
| JP | H09-083484 | 3/1997 |
| JP | 2001077670 A | 3/2001 |
| KR | 20050102594 A | 10/2005 |
| WO | 9944306 | 9/1999 |
| WO | 00/54435 | 9/2000 |

OTHER PUBLICATIONS

Akaiwa et al., "Autonomous decentralized inter-base-station synchronization for TDMA microcellular systems" 1991 IEE 41st Vehicular Technology Conference, 1991, vol. CON 41, May 19, 1991 pp. 257-262.

International Search Report and Written Opinion dated Aug. 5, 2008 for corresponding international application No. PCT/GB2008/000341.

United Kingdom Search Report dated Jun. 12, 2007, for related GB Application No. 0702089.4.

United Kingdom Search Report dated Dec. 4, 2006, for related GB Application No. 0617004.7.

Notice of Allowance dated Aug. 8, 2011, U.S. Appl. No. 12/774,655.

Office Action dated Oct. 27, 2010, U.S. Appl. No. 12/774,655.

Japanese Office Action dated Jun. 1, 2012, JP Application No. 2009-547760.

JP Final Rejection dated Jun. 28, 2013 for JP Application No. 2009-547760.

\* cited by examiner

BASESTATION FOR CELLULAR COMMUNICATION SYSTEM

This invention relates to a basestation for a cellular communication system, and in particular to a method for achieving a required accuracy for the frequencies of signals generated within the basestation.

In common with other radio frequency transmitter and receiver devices, a cellular basestation needs to be able to generate signals having a desired frequency, with an acceptable level of accuracy. These signals can then be used in order to generate the signals that are in fact transmitted over the air interface to other devices. Similarly, these signals can also be used in demodulating signals received over the air interface from other devices.

In order that the signals transmitted by the basestation can be successfully demodulated by their respective receivers, and in order that the basestation can successfully demodulate its received signals, the frequencies of these signals need to be controllable with a high degree of accuracy. For example, the 3GPP specification requires that an oscillator in a basestation should be accurate to +/−0.1 ppm.

The required degree of accuracy can typically be obtained by using an oscillator, such as an Oven Controlled Temperature Compensated (OCXO) crystal oscillator. However, this has the disadvantage that such oscillators are somewhat expensive, in particular relative to the overall cost of a basestation that may only intended be to provide coverage over a relatively small area.

According to an aspect of the present invention, there is provided a method for controlling operation of an oscillator in a basestation of a cellular communications system, the method comprising:
 detecting signals transmitted by at least one other basestation of the cellular communications system;
 estimating a frequency error between a signal generated within said basestation and the detected signals transmitted by said at least one other basestation; and
 controlling operation of said oscillator to minimize said error.

According to an aspect of the present invention, there is provided a method for controlling operation of an oscillator in a basestation of a cellular communications system, the method comprising:
 requesting a mobile device to report a first measurement of a time difference between frames transmitted from the basestation and another basestation;
 requesting the mobile device to report a second measurement of the time difference between frames transmitted from the basestation and the other basestation;
 based on said reported first and second measurements, estimating a frequency offset between a signal generated within said basestation and a corresponding signal generated within said other basestation; and
 controlling operation of said oscillator based on said estimated frequency offset.

This has the advantage that the basestation can use timing information from other basestations, in order to compensate for any frequency inaccuracies. This means that the basestation can be provided with a relatively low cost oscillator.

For a better understanding of the present invention, and to show how it may be put into effect, reference will now be made, by way of example, to the accompanying drawings, in which:—

Figure 1:
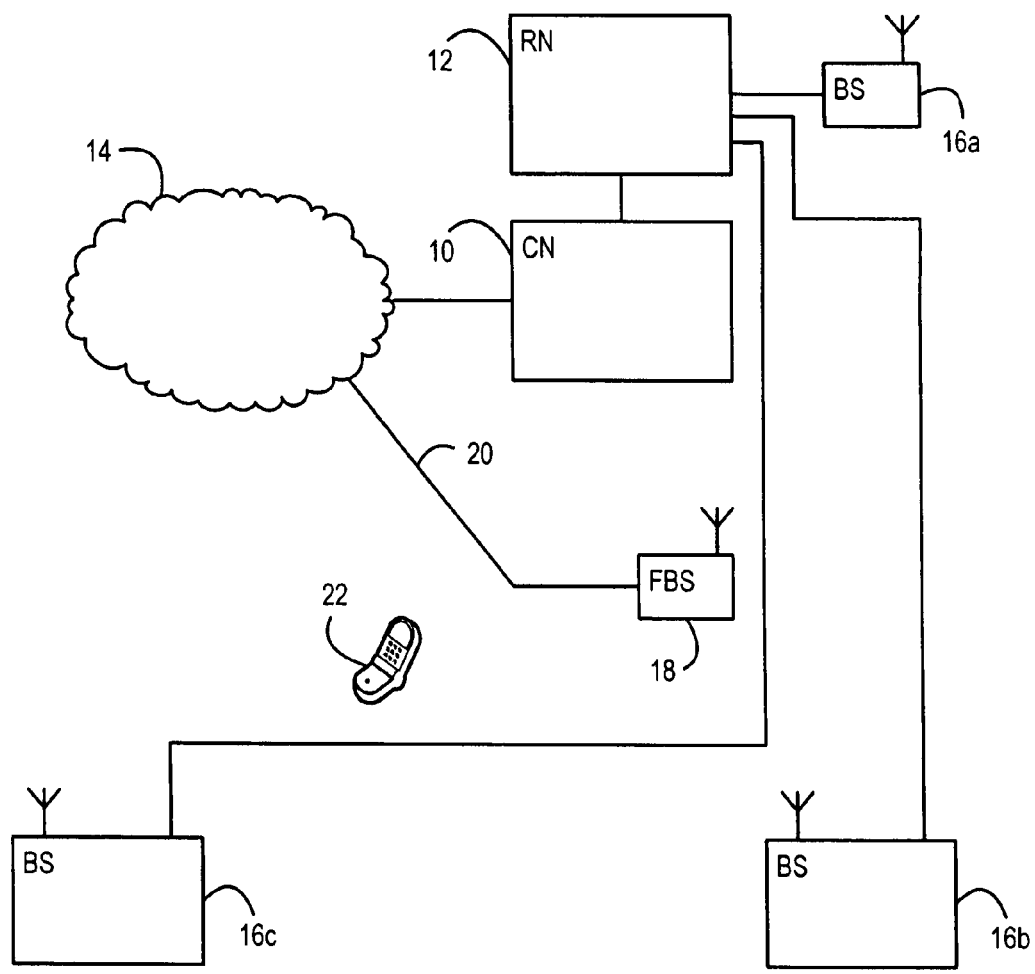
FIG. 1 is a block schematic diagram, illustrating a part of a cellular wireless communications network in accordance with an aspect of the present invention.

FIG. 1 illustrates a part of a cellular wireless communications network in accordance with an aspect of the present invention. Specifically, FIG. 1 shows a core network (CN) 10 and a radio network (RN) 12 of a cellular wireless communications network. These are generally conventional, and are illustrated and described herein only to the limited extent necessary for an understanding of the present invention.

Thus, the core network 10 has connections into the Public Switched Telephone Network (PSTN) (not shown) and into a packet data network, for example the internet 14. The radio network 12 may include, for example, a GSM radio network and/or a UMTS radio network, which are then generally conventional. As shown in FIG. 1, the radio network 12 has a number of basestations (BS) 16a, 16b, 16c connected thereto.

As will be recognized by the person skilled in the art, a typical radio network 12 will have many such basestations connected thereto. These basestations provide coverage over respective geographic areas, or cells, such that a service is available to subscribers. Often, there is a group of basestations that together provide coverage to the whole of the intended service area, while other basestations provide additional coverage to smaller areas within that intended service area, in particular to smaller areas where there is expected to be more demand for the service. The cells served by the basestations of the first group are then referred to as macrocells, while the smaller areas served by the additional basestations are referred to as microcells.

Although the invention is described herein with reference to a cellular network operating in accordance with the 3GPP-WCDMA standards, it will be appreciated that it is equally applicable to any network operating in accordance with any standards or protocols.

FIG. 1 also shows an additional basestation 18 that can be used to provide coverage over a very small area, for example within a single home or office building. This is referred to as a femtocell basestation (FBS). The femtocell basestation 18 is connected into the mobile network operator's core network 10 over the internet 14, by means of the customer's existing broadband internet connection 20. Thus, a user of a conventional mobile phone 22 can establish a connection through the femtocell basestation 18 with another device, in the same way that any other mobile phone can establish a connection through one of the other basestations of the mobile network operator's network, such as the basestations 16a, 16b, 16c.

As mentioned above, the macrocell basestations provide coverage to the whole of the intended service area including the location of the femtocell basestation 18 and the location of the mobile phone 22 while it is in the coverage area of the femtocell basestation 18.

This property is used in aspects of the present invention, as will be described in more detail below.

Figure 2:
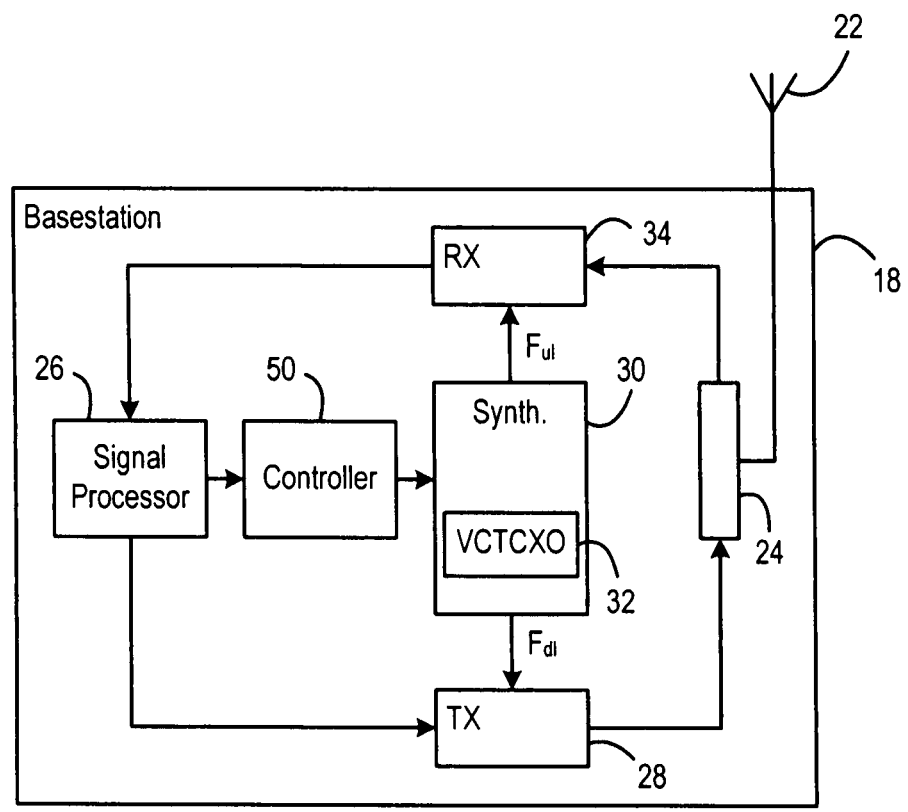
FIG. 2 is a block schematic diagram of a basestation in accordance with an aspect of the present invention.

FIG. 2 is a schematic diagram, illustrating in more detail the form of the basestation 18. The basestation has an antenna 22, connected to a duplexer 24. In the case where the cellular wireless network operates on the frequency division duplex principle, where each device can simultaneously transmit and receive radio frequency signals on a pair of frequencies having a known relationship, the duplexer is effectively a pair of matched filters that allow signals at the system downlink frequencies (that is, the transmit frequencies of the basestation 18) to be passed to the antenna 22, and allow signals at the system uplink frequencies (that is, the receive frequencies of the basestation 18) to be passed from the antenna 22.

In addition, in preferred embodiments of the present invention, the basestation 18 is also able to detect signals transmitted by other basestations, such as the basestations 16a, 16b, 16c, at allocated system downlink frequencies. For example, the basestation 18 may be provided with separate receiver circuitry, corresponding to the receiver circuitry conventionally found in a user device such as a mobile phone, or further means may be provided for allowing signals at the system downlink frequencies, received at the antenna 22, to be received in the basestation 18.

The basestation 18 includes a signal processor 26. In the case of signals for transmission by the basestation 18, the signal processor 26 receives the digital signals, converts them to the required format based on the communications standard used by the basestation, and passes the signals to transmit RF circuitry (TX) 28. As is generally conventional, the transmit RF circuitry 28 converts the signals to analog form, and upconverts them to the required radio frequency using an oscillator signal at a downlink frequency $F_{dl}$. The oscillator signal is supplied by synthesizer circuitry 30, which includes a VCTCXO (voltage controlled temperature compensated crystal oscillator) 32, which typically will have a frequency accuracy of +/−2.5 ppm. The RF signals can then be passed through the duplexer 24 to the antenna 22 for transmission.

In the case of signals transmitted by a mobile device having a connection with the basestation 18, the signals are received at the antenna 22, and passed through the duplexer 24 to receive RF circuitry (RX) 34. As is generally conventional, the receive RF circuitry 34 downconverts the signals from the relevant radio frequency using an oscillator signal at an uplink frequency $F_{ul}$, and converts them to digital form. The oscillator signal is also supplied by the synthesizer circuitry 30, based on a signal generated by the VCTCXO 32. The digital signals are then passed to the signal processor 26.

The synthesizer circuitry 30 operates under the control of a controller 50. In particular, in the context of the present invention, the controller 50 applies a control voltage signal to the VCTCXO 32, in order to control the frequencies of signals generated therefrom.

In accordance with the present invention, the basestation 18 uses information derived from signals transmitted by other network nodes, in particular the macrocell basestations 16a, 16b, 16c and/or any attached mobile phone 22 within the coverage area of the femtocell basestation 18, in order to optimize its own operation.

As mentioned above, the basestations provide coverage to the whole of the intended service area including the location of the femtocell basestation 18 and the location of the any attached mobile phone 22 within the coverage area of the femtocell basestation 18.

As mentioned above, the femtocell basestation 18 uses a relatively low cost oscillator, such as a VCTCXO (voltage controlled temperature compensated crystal oscillator), which will typically have a frequency accuracy of +/−2.5 ppm. By contrast, the 3GPP specifications require that a basestation should be able to generate local oscillator frequency signals with a frequency accuracy of +/−0.1 ppm or better, and +/−0.05 ppm in the case of macrocell basestations.

Techniques are therefore used to calculate and correct for the frequency error within the femtocell basestation 18. Specifically, processes can be performed in order to form an estimate of the frequency error associated with the signals generated by the synthesizer circuitry 30. Then, the control signal applied by the controller 50 to the synthesizer circuitry 30 can be adjusted in order to correct for this error.

Figure 3:
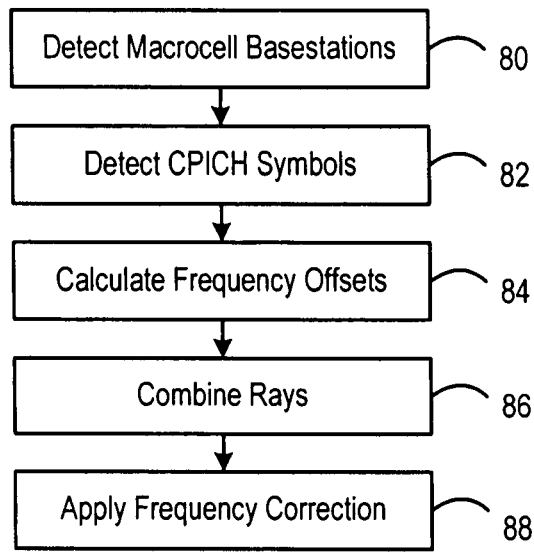
FIG. 3 is a flow chart, illustrating a first method in accordance with the present invention.

FIG. 3 is a flow chart, illustrating a first method of estimating the frequency error, in accordance with an aspect of the invention.

In step 80 of the process, the basestation 18 identifies all detectable macrocell basestations, such as the macrocell basestations (or Node Bs) 16a, 16b, 16c shown in FIG. 1, and, in step 82, it captures CPICH symbols transmitted from these basestations. The basestation 18 can advantageously detect signals transmitted by other basestations by momentarily discontinuing its own transmissions, or can be provided with suitable receiver circuitry to be able to detect such signals while continuing its normal operation uninterrupted. These signals can advantageously be detected when the basestation is powered up, and at predetermined intervals thereafter, or can be detected at any convenient intervals. The signals should be detected sufficiently frequently that they can be used to control the frequency of the oscillator 32 and keep it within the required accuracy.

As discussed above, macrolayer basestations are typically provided with more accurate frequency reference circuitry than femtocell basestations. In this embodiment of the invention, it is therefore preferred that only signals transmitted from macrocell basestations should be detected, as these signals can be used more reliably than signals transmitted from femtocell basestations in correcting the frequency reference circuitry of the basestation 18. For example, each femtocell basestation may include in its transmissions something that identifies it as such. Alternatively, each femtocell basestation may be provided with a list of access codes used by other femtocell basestations. In another alternative, a management system may inform the femtocell basestation 18 as to which of its received transmissions originated from macrocell basestations.

In any event, in another embodiment of the invention, the process takes account of transmissions from all detectable basestations, regardless of whether they are macrocell basestations or femtocell basestations. This relies on the facts that the frequency reference circuitry in such femtocell basestations should already have been subject to correction, and should therefore be acceptably accurate, and that the averaging process described below is sufficiently robust that the overall result is not excessively disturbed by receiving a somewhat inaccurate frequency signal.

The basestation 18 then estimates the carrier frequencies of these neighbour macrolayer Node Bs 16a 16b, 16c. Specifically, in step 84, the basestation 18 performs a frequency offset calculation for each of the detected basestations.

It is known that each of the de-spread symbols of the P-CPICH should be represented by the vector (1+j) in the phase plane, and so the phase of each transmitted symbol is known. The basestation 18 then detects these symbols using its own internally generated reference frequency. A frequency offset between the carrier frequency of the transmitted C-PICH signals and this internally generated reference frequency will cause the chips to rotate slightly over time. Specifically, the amount of the rotation depends on the size of the frequency offset, and the rotation accumulates over time.

In an ideal case, with no noise, the phase difference between any two adjacent symbols s(n) and s(n+1) will be φ, and so the frequency difference Δf can be determined to be:

$$\Delta f = s(n+1)s^*(n).$$

This can therefore be averaged over a large number, N, of symbols:

$$\Delta f = \frac{1}{N} \sum_{n=1}^{N} s(n+1) \cdot s^*(n)$$

which, with no noise, is equivalent to:

$$\Delta f = \sum A \cdot e^{j(\theta+(n+1)\phi)} \cdot A \cdot e^{-j(\theta+n\phi)}$$
$$= \sum A^2 e^{j\phi}$$
$$= N \cdot A^2 e^{j\phi}$$

Clearly we will not be in a noise free environment, but the averaging effect should help to ensure that we have a reasonable estimate for the ray.

The next stage, in step 86 of the process, is to combine the rays for a given Node-B, using an approximation to the maximal ratio combining (MRC) scheme. Thus, to minimise the impact of the noise, a scale factor is generated for each ray based on an estimate of the SNR for the ray. This is only an imprecise estimate, due to the fact that we are not yet in a position to compensate for frequency error and channel effects, and consequently it is necessary to base this on the mean and variance of the absolute value of the symbols. Thus, the Cartesian values computed as described above are weighted and combined to give a final phasor which is then converted into a phase φ using the arctan function.

Then, in step 88, a frequency correction is determined and applied, based on a combination of measurements from detectable basestations. At this stage, the SNR of the detected signals should also be taken into account. Now, the metric for the Ec/Io ratio should be available and should be considered a more reliable figure than the approximation used above. The calculation then becomes a centre of gravity calculation, where each moment is the product of the SNR and the frequency offset estimate for a given basestation. Summing the moments for all Node-Bs and dividing by the mean SNR will yield the frequency corresponding to the centre of gravity of the curve described by the frequency offsets and SNR estimates.

It will be appreciated that other techniques can be applied, including simply selecting an average (for example the mean, or more preferably, to avoid distortions caused by a single inaccurate calculation, the median) of the calculated frequency offsets.

The frequency correction can then be applied by applying a correction voltage through a digital-to-analogue converter to a control input of the VCTCXO 22.

Figure 4:
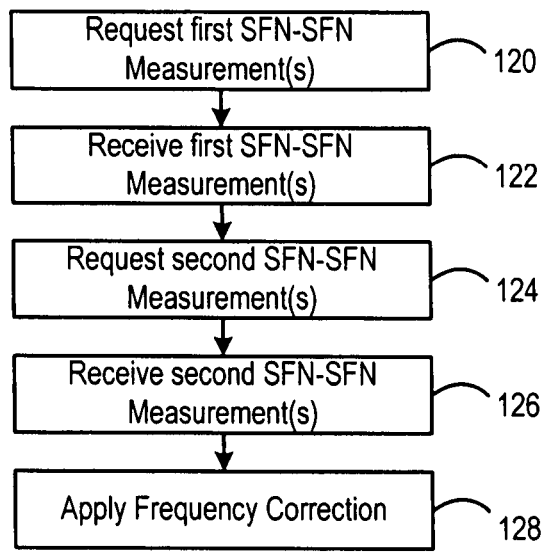
FIG. 4 is a flow chart, illustrating a second method in accordance with the present invention.

FIG. 4 is a flow chart, illustrating a second method of estimating the frequency error, in accordance with an aspect of the invention.

In this second method, the basestation 18 requests SFN (System Frame Number) to SFN measurements from the UE 18. Since the relative SFN frame boundary position between the basestation 18 and neighbouring Node-Bs is related to the local oscillator reference of the basestation 18, using UE SFN to SFN measurements provides an estimate of the frequency offset between the basestation 18 and the neighbour Node-B. This can be used by the basestation 18 to correct its local frequency reference offset.

The System Frame Number (SFN) is a key 10 msec counter from which all the timing of the Down Link physical layer channels (e.g. P-SCH, S-SCH, CPICH) are derived, within any basestation, including the basestation 18 and the surrounding macrocell basestations 16*a*, 16*b*, 16*c*. The accuracy of the SFN frame timing within a particular Node-B is the function of its local frequency reference. Hence, if the local frequency reference has an accuracy specification of +/−0.1 ppm or +/−0.05 ppm then the SFN data clock will have the same timing accuracy.

In order to support handover, the UE can be asked to report SFN-SFN measurements from a selected neighbour cell and the basestation to which it is attached, in this case the basestation 18. This measurement is the time difference between two different SFN boundaries. If the frequency offset between the two local oscillators was zero, it would stand to reason that, between two consecutive SFN-SFN measurements, this time difference, reported from the UE 22 to the basestation 18, would remain constant.

On the other hand, a difference between two consecutive SFN-SFN measurements would imply that there is a frequency offset between the two local oscillators. The difference essentially is the error signal and would be used to correct the VCTCXO 32 frequency offset through a Digital to Analogue (D/A) converter. Repeated SFN-SFN measurements can be averaged over multiple measurements to reduce the effects of inaccuracies in the SFN-SFN measurements. Multiple neighbour Node-Bs could also be used to obtain an average reference frequency and hence reduce the bias effect of the frequency error of a single neighbour Node-B.

In step 120 of the process, at a time $T_0$, the basestation 18 requests a first SFN-SFN measurement from a UE, such as the UE 22, that is within its coverage area. This request must specify one or more particular neighbour macrolayer basestations, such as the basestation 16*a*. Although the method can be performed by requesting measurements in one of the neighbour macrolayer basestations, greater accuracy may be achievable by requesting measurements from multiple neighbour macrolayer basestations, and then forming an average of the results. It may be possible to obtain all such measurements in a single time interval, or it may be necessary to obtain all requested measurements at different times.

In step 122, the basestation 18 receives the reported first SFN-SFN measurement from the UE.

In step 124, at a time $T_1$, the basestation 18 requests a second SFN-SFN measurement from the UE, specifying the same neighbour macrolayer basestations, such as the basestation 16*a*.

In step 126, the basestation 18 receives the reported second SFN-SFN measurement from the UE.

Any difference between the reported first SFN-SFN measurement and the reported second SFN-SFN measurement from each neighbour macrolayer basestation results from a frequency offset between the oscillator signal used in the basestation 18 to generate the frame timing, on the one hand, and the oscillator signal used in the relevant macrolayer basestation 16*a* to generate its frame timing, on the other hand.

As an example of the above process, if the neighbour Node-B frequency reference has an accuracy of +0.01 ppm compared to the nominal frequency (i.e. within the accuracy specified by the 3GPP specifications) and the frequency reference in the basestation 18 when uncompensated has an accuracy of −2.5 ppm, then the total frequency error between that neighbour Node-B and the basestation 18 is −2.49 ppm.

This inaccuracy will result in a chip rate difference of approximately −1.542 chips every second as the following equation would indicate for a 10 MHz reference:

Chip rate error=(3.84Mcs/−2.49ppm)chips/sec, where 3.84Mcs is the standard chip rate.

If the reported first SFN-SFN measurement at the time $T_0$ is, say, 1000 chips, and if the time $T_1$, at which the second measurement takes place, is equal to $T_0+100$ seconds, then the second SFN-SFN measurement would report 1000−154.2 chips=845.8 chips, as the chip rate difference of approximately −1.542 chips every second would have accumulated over the 100 seconds that elapsed between the first SFN-SFN measurement and the second SFN-SFN measurement.

This difference between the two SFN-SFN measurements can then be used to derive an estimate for the frequency error between the neighbour Node-B and the basestation 18, calculated in the following manner:

Frequency Error=$[3.84\times10^6[(845.8-1000)/100$ seconds$]]$ppm

In step 128, the frequency offset is used to determine a frequency correction that can be applied through a Digital to Analogue (D/A) converter to the VCTCXO 32. The D/A voltage applied to the VCTCXO is then calculated as:

*D/A* voltage=*D/A* voltage previous+(frequency error*$XTAL$ frequency/voltage slope).

Finally, as described above, the frequency error can be averaged over multiple measurements and multiple Node-Bs to minimize the measurement errors.

There are therefore described methods for controlling the frequency of an oscillator signal, based on measurements relating to other network nodes, that permit the use of lower specification, and hence less expensive, oscillator devices.

The invention claimed is:

1. A method for controlling operation of an oscillator in a basestation of a cellular communications system, the method comprising:
   detecting, by the basestation, signals transmitted by at least one other basestation of the cellular communications system, the signals transmitted by the at least one other basestation on system downlink frequencies for purposes of communication with user equipment devices;
   estimating a frequency error between a first reference oscillator signal generated within said basestation by a first oscillator and reference oscillator signal or signals generated within said at least one other basestation, the estimate of frequency error based on the detected signals transmitted by said at least one other basestation;
   controlling operation of said first oscillator to minimize said frequency error; and
   generating, in the base station, signals at system uplink frequencies and system downlink frequencies of the cellular communications system based on oscillator signals generated by said first oscillator, the oscillator signals resulting from controlling the operation of said first oscillator to minimize said error.

2. A method as claimed in claim 1, further comprising estimating said frequency error based on Common Pilot Channel (CPICH) signals transmitted by the least one other basestation.

3. A method as claimed in claim 1, further comprising:
   detecting signals transmitted by a plurality of other basestations of the cellular communications system;
   forming estimates of a quality of each of said signals; and
   estimating a combined frequency error based on estimated frequency errors between the signal generated within said basestation and the detected signals transmitted by the other basestations, wherein the estimation of the combined frequency error takes into account said quality estimates.

4. A method as claimed in claim 3, wherein the step of estimating the combined frequency error comprises forming a weighted sum of the estimated frequency errors between the signal generated within said basestation and the detected signals transmitted by the other basestations.

5. A method as claimed in claim 3, wherein the step of forming estimates of the quality of each of said signals comprises estimating the signal to noise ratios of said signals.

\* \* \* \* \*